United States Patent
Kurtz et al.

[11] Patent Number: 5,622,902
[45] Date of Patent: Apr. 22, 1997

[54] PASSIVATION/PATTERNING OF PZR DIAMOND FILMS FOR HIGH TEMPERATURE OPERABILITY

[75] Inventors: Anthony D. Kurtz, Teaneck; Alexander A. Ned; Timoteo I. Vergel de Dios, both of Bloomingdale, all of N.J.

[73] Assignee: Kulite Semiconductor Products, Inc., Leonia, N.J.

[21] Appl. No.: 615,458

[22] Filed: Mar. 14, 1996

[51] Int. Cl.⁶ .............................. H01L 21/31; H01L 21/77
[52] U.S. Cl. ............................. 438/50; 438/763; 438/958; 438/791
[58] Field of Search ........................... 437/248, 235, 437/238, 901, 241, 921, 100; 148/DIG. 148, 228

[56] References Cited

U.S. PATENT DOCUMENTS

| | | | |
|---|---|---|---|
| H1287 | 2/1994 | Zeisse et al. | 257/410 |
| 3,800,264 | 3/1974 | Kurtz et al. | 73/727 |
| 3,930,823 | 1/1976 | Kurtz et al. | 257/794 |
| 5,135,885 | 8/1992 | Furukawa et al. | 437/100 |
| 5,165,283 | 11/1992 | Kurtz et al. | 73/727 |
| 5,303,594 | 4/1994 | Kurtz et al. | 73/727 |
| 5,451,430 | 9/1995 | Anthony et al. | 427/249 |
| 5,514,603 | 5/1996 | Sato | 437/100 |
| 5,538,911 | 7/1996 | Yamazaki | 437/127 |

OTHER PUBLICATIONS

J.L. Davidson, R. Ramasham, C. Ellis, J. Electrochem. Soc., 137, 10 (1990) pp. 3206–3210.

D.R. Wur, J.L. Davidson, W.P. Kang, D.L. Kinser, IEEE J Microelectromech. Syst. 4, 1 pp. 34–41, (1995).

J.L. Davidson, J.S. Shor, D.R. Wur, and A.D. Kurtz, J. Electrochem. Soc., 141, 12, pp. 3522–3525, (1994).

Michael W. Geis and John C. Angus, "Diamond Film Semiconductors", *Scientific American*, pp. 84–89, Oct. 1992.

Primary Examiner—Michael Trinh
Attorney, Agent, or Firm—Plevy & Associates

[57] ABSTRACT

A method for passivating diamond films to substantially prevent them from oxidizing at temperatures up to 800° C. in an oxygen atmosphere. The method involves depositing one or more passivating layers over the diamond film wherein one of the layers is nitride and the other layer is quartz. The passivation technique is directly applicable to diamond sensor pressure transducers and enable them to operate at temperatures above 800° C. in oxygen environments. The passivation technique also provides an economical and simple method for patterning diamond films.

22 Claims, 7 Drawing Sheets

PASSIVATION/PATTERNING OF PZR DIAMOND FILMS FOR HIGH TEMPERATURE OPERABILITY

ACKNOWLEDGEMENTS

The research which is the subject matter of the present invention was carried out under a Phase II SBIR grant from the Army Research Office, Contract No. DAAH04-94-C-0009.

FIELD OF THE INVENTION

The present invention relates generally to diamond films and more particularly, to a cost effective method for patterning diamond films into circuit patterns and other the like structures, and enabling the diamond films to withstand temperatures in excess of 800° C.

BACKGROUND OF THE INVENTION

Industry continues to demand miniature pressure transducers which are capable of operating at high temperatures in excess of 800° C. Such transducers are extremely desirable for use in satellites, nuclear power, chemical processing, aerodynamics, engine testing, and other applications.

As is well known in the art, pressure transducers generally include a force collector and one or more piezoresistive sensor elements. Many different types of pressure transducer structures have been proposed to increase the reliability and accuracy of such devices in high temperature applications.

For example, some pressure transducers employ a metal force collector which includes one or more sensor elements bonded thereto with an epoxy. The sensitivity of such a transducer is initially relatively low and degrades further when the transducer is subjected to high temperature operating environments. Other pressure transducer designs employ silicon (Si) force collectors with integrally formed pn junction isolated Si sensor elements. Such pressure transducers can operate up to approximately 350° C. before the pn junction isolation deteriorates. Still other pressure transducer designs utilize Si sensor elements which are dielectrically isolated from a Si force collector. Examples of such transducer designs can be seen in U.S. Pat. Nos. 3,800,264 and 3,930,823, both entitled HIGH TEMPERATURE TRANSDUCERS AND HOUSING INCLUDING FABRICATION METHODS, and both issued to A.D. Kurtz et al. and assigned to Kulite Semiconductor Products, Inc., the assignee herein. The pressure transducers described therein are capable of operating in excess of 500° C. When the operating temperatures exceed 600° C., however, the Si sensor elements and the Si force collector undergo plastic deformation which renders the transducer inoperable.

Other materials such as silicon carbide (SIC) have been employed in the fabrication of pressure transducers to increase their operating temperature. The use of SiC in pressure transducers is described in detail in U.S. Pat. No. 5,165,283 entitled HIGH TEMPERATURE TRANSDUCERS AND METHODS OF FABRICATING THE SAME EMPLOYING SILICON CARBIDE, issued to A.D. Kurtz et al. and assigned to Kulite Semiconductor Products, Inc., the assignee herein. This patent describes a pressure transducer which employs pn junction isolated SiC sensing elements on a SiC force collector. Such a pressure transducer is capable of operating at temperatures greater than 600° C. However, the SiC material from which the sensing elements are formed, exhibits a relatively low gauge factor which is approximately 31. The gauge factor of the sensing elements control the output signal of the pressure transducer, which is an important operating parameter of such a device. Generally, sensing elements fabricated from a material exhibiting a higher gauge factor yields a higher output signal level than sensing elements fabricated from a material exhibiting a lower gauge factor.

In order to increase the output signal of a SiC pressure transducer, the prior art has proposed fabricating the sensing elements from a polycrystalline diamond (poly-diamond) film. A pressure transducer having a SiC force collector and sensing elements fabricated from a piezoresistive (PZR) polycrystalline diamond film is described in U.S. Pat. No. 5,303,594 entitled PRESSURE TRANSDUCER UTILIZING DIAMOND PIEZORESISTIVE SENSORS AND SILICON CARBIDE FORCE COLLECTOR, issued to A.D. Kurtz et al. and assigned to Kulite Semiconductor Products, Inc., the assignee herein.

Polycrystalline diamond (poly-diamond) films are known to possess excellent thermal properties. Moreover, poly-diamond has a gauge factor of approximately 100, which is substantially higher than the gauge factor of SiC which is 31, as stated earlier above.

The ability to grow diamond films has also open the door to the fabrication of diamond-based semiconductor diodes and transistors as described in an article entitled "DIAMOND FILM SEMICONDUCTORS" by Michael W. Geis et al., SCIENTIFIC AMERICAN, October, 1992. Another application for diamond films has been in the area of injection lasers. In laser applications, diamond films have been employed to replace copper as a heat sink for mounting a laser, since diamond has five times the thermal conductivity of copper. Other applications for diamond films include power devices and applications where film materials are used for providing high abrasion resistance and high impact strength.

The diamond films employed in the applications discussed above, have some disadvantages which up to now, have not been successfully addressed in the prior art. One disadvantage is that diamond films start oxidizing at approximately 600° C. and disintegrate quickly at temperatures approaching 800° C. Another disadvantage associated with diamond films is that diamond films are extremely difficult to pattern into semiconductor and piezoresistive circuit patterns, thus, complicating the fabrication of these structures. Up until now, conventional reactive ion etching (RIE) and lift-off patterning techniques have been used. Patterning poly-diamond films using RIE is very costly, time consuming and cumbersome. Similarly, the lift-off is difficult and places limits on the quality of the diamond films due to the survivability limits of the lift-off films during the diamond deposition process.

It is, therefore, an object of the present invention to provide a method for substantially preventing the oxidation and disintegration of diamond films at temperatures above 600° C.

It is another object of the present invention to provide an improved method for patterning diamond films which substantially overcomes the problems of prior art techniques.

SUMMARY OF THE INVENTION

A method for substantially preventing a diamond film coated substrate from oxidizing at temperatures up to 800° C. in an oxygen atmosphere. The method comprises placing the diamond film coated substrate into a reactor set substantially below a temperature at which diamond oxidizes and evacuating the reactor to substantially remove all oxygen therefrom. The reactor is then raised to a predetermined temperature and a passivation layer is then deposited over the diamond film. The passivation layer coats the diamond film to effectively prevent the diamond film from oxidizing at temperatures up to 800° C. in an oxygen atmosphere.

Further, a method for fabricating a semiconductor circuit patterns from a diamond film coated substrate, which is capable of withstanding temperatures up to 800° C. in an oxygen atmosphere. The method comprises passivating the diamond film coated substrate as described above and then patterning the passivation layer to selectively expose regions of the diamond film. The selectively exposed regions of the diamond film are subsequently oxidized thereby creating one or more semiconductor circuit patterns from the diamond film. When the semiconductor circuit patterns are the piezoresistive elements which make up a pressure transducer, the passivated regions of the diamond film enable the transducer to operate in temperatures up to 800° C. in an oxygen atmosphere.

Also described is a transducer produced by the method described above, which is capable of withstanding temperatures up to 800° C. in an oxygen atmosphere. The transducer comprises a substrate of semiconductive material and at least one sensor fabricated from a diamond film disposed on the substrate. The at least one passivation layer is disposed on the sensor and is fabricated from a material which substantially prevents the sensor from oxidizing at temperatures up to 800° C. in an oxygen atmosphere.

BRIEF DESCRIPTION OF THE DRAWINGS

For a detailed understanding of the present invention, reference should be made to the following detailed description taken in conjunction with the accompanying drawings wherein:

FIG. 5C is an enlarged side by side view of the photographs of FIGS. 5A and 5B where FIG. 5B is on the left and FIG. 5A is on the right;

DETAILED DESCRIPTION OF THE INVENTION

Although the method of the present invention can be used in many different applications where patterned diamond films are employed such as in the fabrication of diamond based semiconductor diodes and transistors, the present invention is especially suited for use in fabricating diamond based pressure transducers. Accordingly the present invention will be described in conjunction with the fabrication of a pressure transducer having a SiC force collector and sensing elements fabricated from a piezoresistive (PZR) polycrystalline diamond film.

The passivation/patterning technique of the present invention generally employs a passivation film which is applied over a diamond film by preferably a low pressure chemical vapor deposition technique (LPCVD). The passivation film preferably comprises a nitride film, although other passivation films such as metal films and the like can be used. The passivation film can optionally include a second film such as quartz applied over the first passivation film. The passivation films applied in accordance with the method of the present invention substantially prevent the penetration of oxygen into the diamond film and also provide a cost effective technique for patterning the diamond film. Diamond films which have been passivated in accordance with the present invention, have been demonstrated to not oxidize or disintegrate at temperatures up to 800° C. in the presence of oxygen.

Figure 1A:
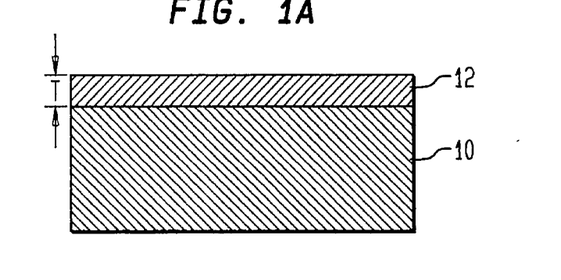
FIGS. 1A–1C are cross-sectional views which depict the various steps of the passivation method of the present invention.

FIG. 1A depicts the first processing step of the method of the present invention. As shown, a substrate 10 of SiC or Si is coated with an undoped diamond film 12. The diamond film 12 can include either single crystal diamond or poly-diamond, although poly-diamond is preferred and utilized in this embodiment because of the prohibited cost of single crystal diamond. The poly-diamond film 12 is preferably grown by a plasma assisted chemical vapor deposition process (CVD) in which methane and hydrogen are used as carrier gases. Deposition of the poly-diamond film 12 is performed at a temperature of approximately 900° C. and a pressure of 45 Torr. Preferably, the poly-diamond film 12 is grown to a thickness T of approximately 2–5 microns. The growth of poly-diamond films on semiconductor substrates is well known in the art and is described in greater detail in U.S. Pat. No. 5,303,594, the disclosure of which is incorporated herein by reference.

Figure 1B:
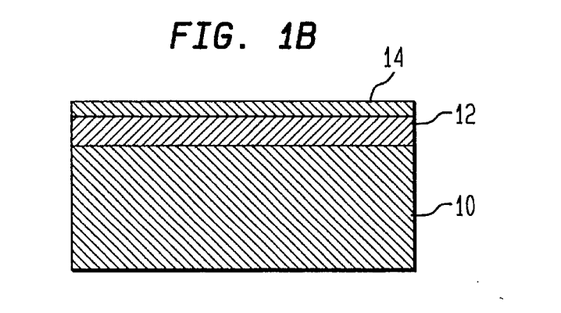

FIG. 1B depicts the substrate 10 after depositing a stoichiometric silicon nitride ($Si_3N_4$) passivation film 14 or other passivation film, over the poly-diamond film 12. The $Si_3N_4$ film 14 substantially prevents the poly-diamond film 12 from oxidizing during high temperature exposure in excess of 800° C. in the presence of oxygen. The deposition of the $Si_3N_4$ film 14 is performed at a temperature of approximately 750° C. In order to prevent decomposition of the poly-diamond film 12 at the deposition temperature, the substrate 10 is loaded into a reactor chamber which is set at a temperature approximately 550° C. The reactor chamber is then evacuated down to 1 milli-Torr and ramped up to 750° C. The deposition proceeds with the injection of ammonia ($NH_3$) and dichlorosilane ($SiH_2Cl_2$) into the reactor chamber. When the deposition is complete, the reactor is cooled to 550° C. before venting the reactor chamber to atmosphere.

Figure 1C:
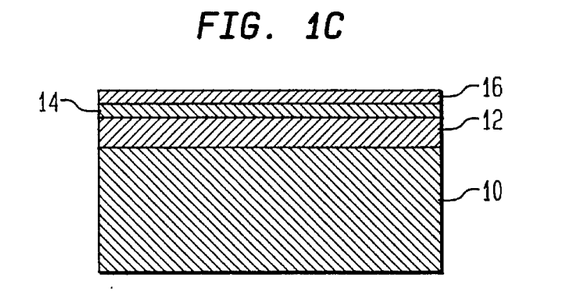

Transducer sensor patterns can be defined using the $Si_3N_4$ film as will be later described. This is accomplish by depositing a quartz film or other like material, which serves as a mask for nitride etching. The quartz film can optionally serve as a second passivation film if desired. Accordingly, in FIG. 1C, a quartz film 16 ($SiO_2$) has been deposited over the $Si_3N_4$ film 14. The quartz film 16 can be sputtered on top of the $Si_3N_4$ film 14 or applied using any other suitable technique. To achieve a dense and non-porous quartz film, it is necessary to anneal the quartz film 16 at 625° C. in the presence of wet oxygen.

Figure 1D:
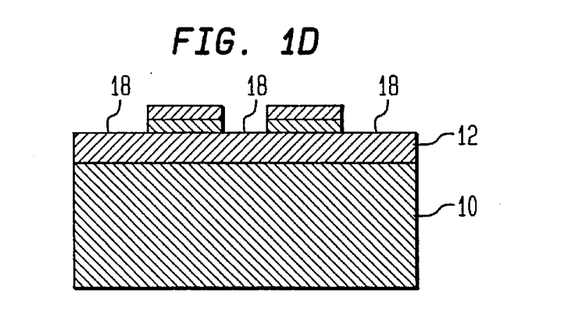
FIGS. 1D and 1E are cross-sectional view which depict how the passivation method of the present invention is used for diamond patterning.
Figure 1E:
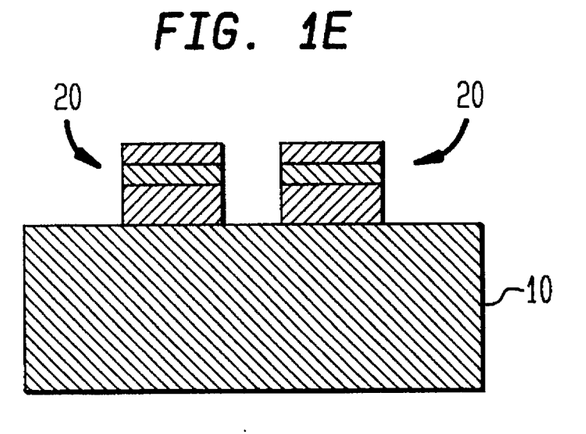

As already mentioned, the method of the present invention also provides an efficient and accurate method for patterning and micromachining diamond films. Thus, after annealing the quartz layer, a coating of photoresist can be deposited over the quartz layer 16 so that semiconductor structures such as sensor, transistor, and diode patterns, can be appropriately defined in both of the nitride and quartz PASSIVATION layers. This leaves regions 18 of the poly-diamond film unpassivated as shown in FIG. 1D. The unpassivated regions, upon exposure to temperatures near 700° C. in the presence of oxygen will be effectively removed thereby defining one or more sensors in the poly-diamond film 12. The rate of such removal, together with the amount of associated undercutting, is determined primarily by the temperature of the ambient in which this patterning is conducted. FIG. 1E depicts the resulting sensor structure 20 after diamond patterning.

Figure 2:
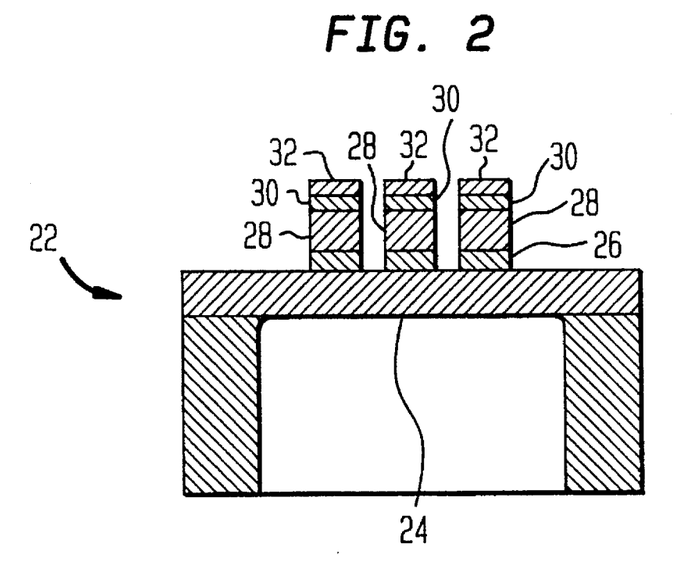
FIG. 2 is a cross-sectional view through a pressure transducer with a diamond sensor element passivated according to the present invention.

The ability to passivate and pattern diamond, enables miniature sensors made in accordance with the present invention, to achieve performance at very high temperatures (>800° C.). In particular, the PASSIVATION technique of the present invention is especially useful for producing pressure transducers which utilize PZR diamond films. An example of such a pressure transducer is described in U.S. Pat. No. 5,303,594. Referring to FIG. 2 there is shown a pressure transducer 22 which utilizes a PZR diamond film. The basic architecture of the transducer 22 is similar to the one shown and described in U.S. Pat. No. 5,303,594. The pressure transducer 22 includes a diaphragm 24 fabricated from semiconductor material such as SiC or Si, an insulating layer 26 such as i-diamond (intrinsic diamond) formed on the top surface of the diaphragm 24 and piezoresistive sensing elements 28 fabricated from a p-diamond film (doped diamond) which has been applied over the insulating layer 26. In another embodiment, the insulating layer could be eliminated and n-type SiC itself used as an insulating member. In any case, the piezoresistive diamond sensing elements are coated with a layer of nitride 30 and optionally, a layer of quartz 32 in accordance with the passivation technique of the present invention. The passivation layers of the present invention enable the pressure transducer of FIG. 2 to withstand temperatures up to 800° C. in an oxygen atmosphere.

As stated earlier, the diamond passivation/patterning technique of the present invention is not limited to only sensors. Since it has been demonstrated that diamond-based semiconductors such as diodes and transistors are now possible, the passivation/patterning technique of the present invention can be used in the fabrication of theses device also. Power devices, injection laser and many other devices which presently employ or could benefit from the use of diamond films will also benefit from the passivation technique of the present invention.

The following discussion demonstrates the effectiveness of the passivation technique of the present invention.

Since diamond reacts rapidly with oxygen at approximately 700° C., the deposition of silicon nitride at 750° C. demonstrates the effectiveness of the passivation films made in accordance with the present invention. A number of silicon wafers coated with undoped CVD poly-diamond were passivated in accordance with the present invention and then evaluated after 30 minutes at the nitride deposition process temperature of 750° C. After nitride processing, the wafers were examined under an optical microscope to determine whether the passivated poly-diamond film experienced any oxidation. The examination revealed that there were no apparent changes in the surface texture of the wafers, which indicates that the poly-diamond films were not oxidized.

Figure 3A:
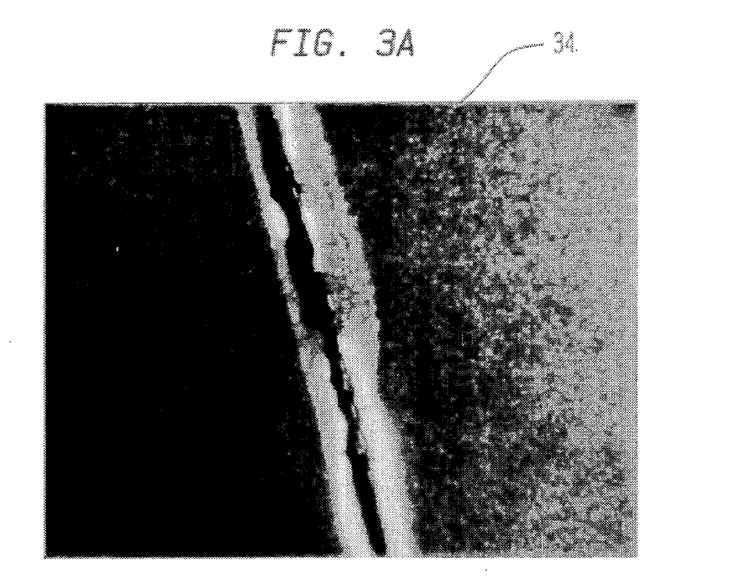
FIG. 3A is a photographic view of a break line on diamond film after being passivated with nitride in accordance with the present invention.
Figure 3B:
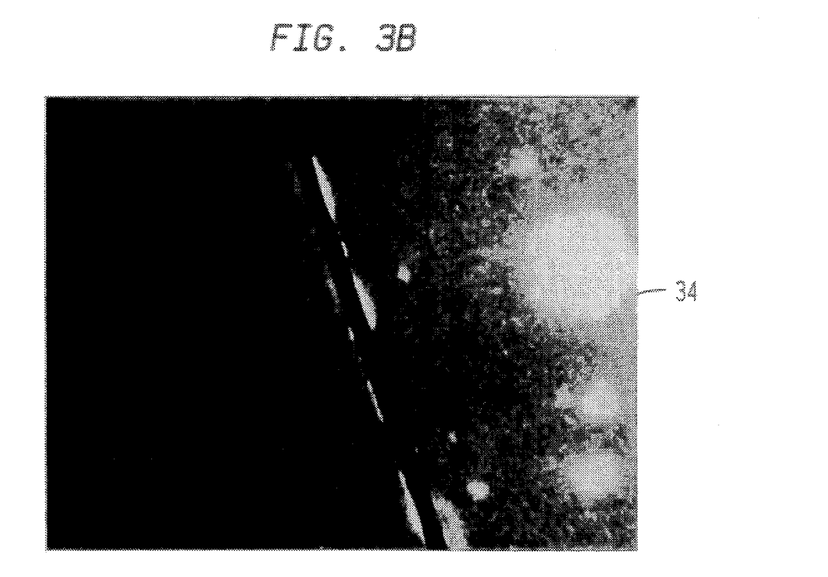
FIG. 3B is an enlarged view of FIG. 3A showing regions where diamond has flaked off along the break line.

The inventors herein have previously observed that whenever a scribe and break operation is performed on a silicon wafer with a diamond layer on its surface, small regions of the diamond will flake off along the scribe line. Accordingly, a scribe and break operation is used as a direct method for verifying the presence of the diamond layer after various processing steps have been performed. FIGS. 3A and 3B depict such flaking along the scribe line 34 of one of wafers described above, confirming the presence of the poly-diamond layer after nitride processing.

As described earlier in the detail description of the method, transducer sensor patterns can be defined using a densified quartz layer as mask for etching the underlying nitride layer. In order to determine whether the annealing process would oxidize the passivated poly-diamond film, a passivated wafer sample was coated with a layer of quartz which was then subsequently annealed at 625° C. in the presence of wet oxygen. The wafer sample was annealed at 625° C. in the presence of wet oxygen for 30 minutes. Upon removal from the furnace, the sample did not show any indication of diamond degradation and the surface morphology remained the same.

Figure 4A:
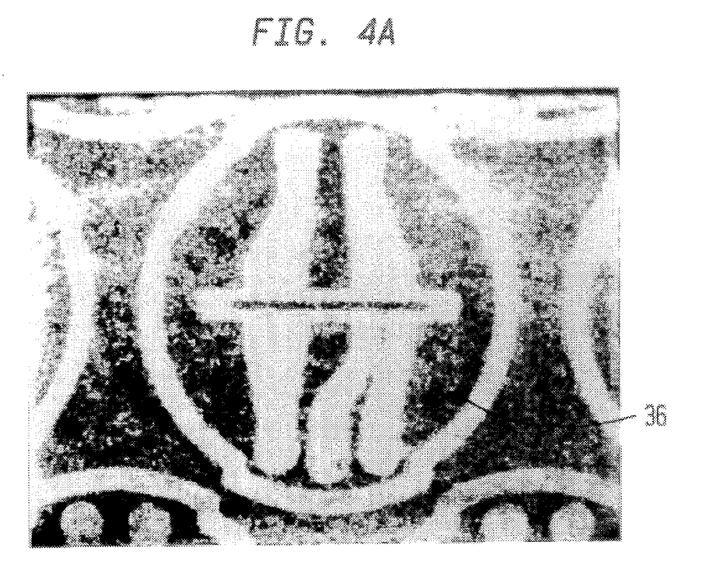
FIG. 4A is a photograph of sensor patterns through unannealed quartz.
Figure 4B:
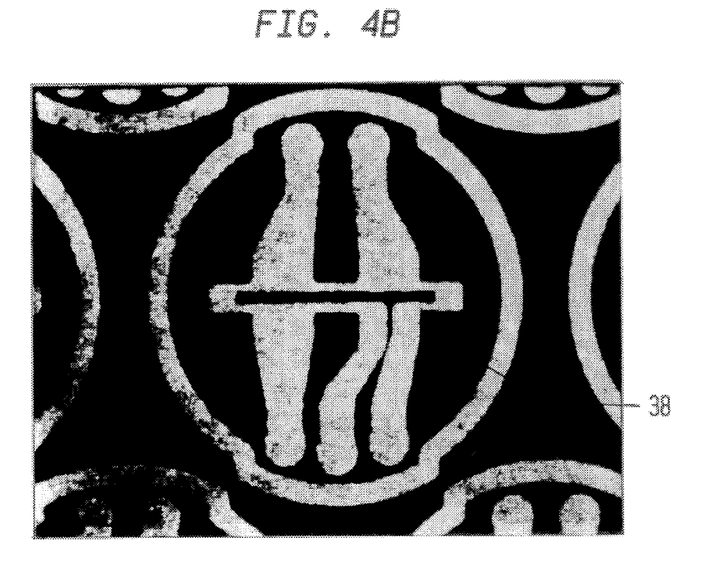
FIG. 4B is a photograph of sensor patterns through an annealed quartz layer made in accordance with the present invention.

Further, the same sample was then subjected to photolithography, quartz and silicon nitride etching to determine the quality of pattern definition. To determine how annealing affected pattern definition, a passivated diamond wafer sample with an unannealed quartz layer was prepared and subjected to photolithography, quartz and silicon nitride etching. As can be seen by comparing the sensor patterns shown in FIGS. 4A and 4B, the wafer sample having the sensor patterns 38 defined through annealed quartz in FIG. 4B had a sharper pattern definition than the wafer sample having the sensor patterns 36 defined through the unannealed quartz in FIG. 4A.

The above discussion demonstrates that a passivation film comprising a first layer of $Si_3N_4$ and a second layer of annealed quartz make it possible to subject such a passivated poly-diamond film to temperatures of 800° C. This enables a pressure transducer employing piezoresistive sensors fabricated from diamond to operate at temperatures up to 800° C. Moreover, the annealed quartz layer enhances the pattern definition of the sensors.

Figure 5A:
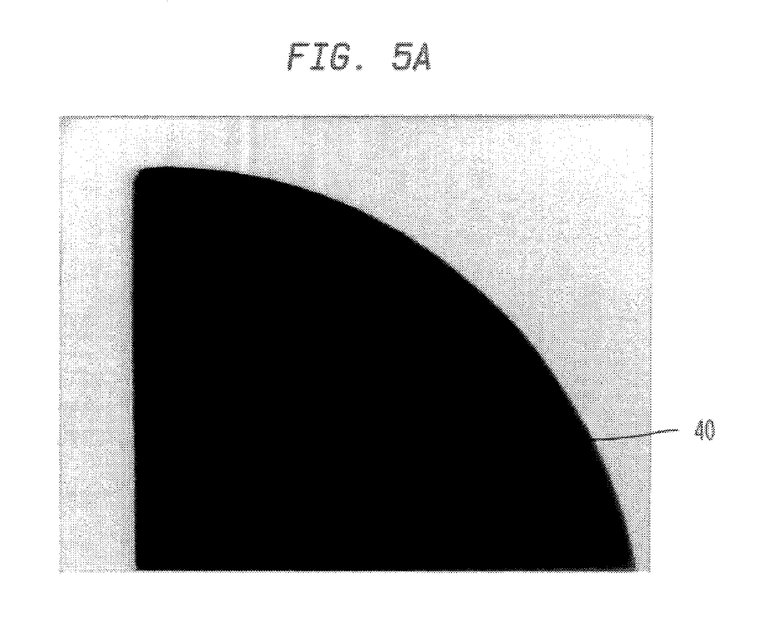
FIG. 5A is a photograph of a silicon nitride layer over undoped diamond on silicon.

Comparisons were also made between a single layer passivations and a double layer passivations. This was accomplished by quartering a silicon wafer having a uniformly thick layer of undoped diamond. One of the quartered samples was placed inside an oven at room temperature. The oven was then ramped up to 800° C., in 40 minutes. After 30 minutes at 800° C., the sample was removed from the oven and allowed to cool. Visual inspection observed a few very small areas devoid of diamond. FIG. 5A shows one of the quartered samples which was not exposed to the 800°

Figure 5B:
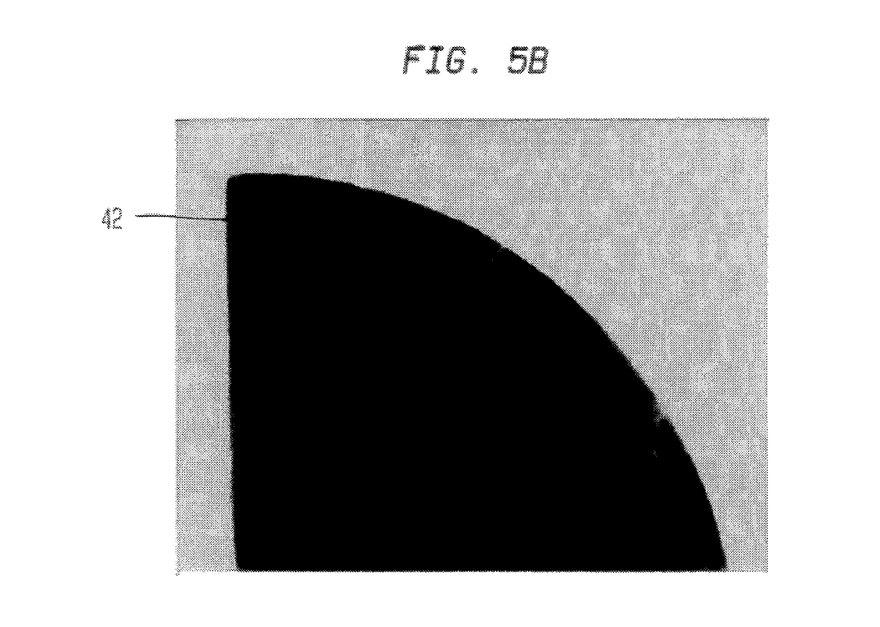
FIG. 5B is a photograph of a silicon nitride layer over undoped diamond on silicon after 30 minutes in 800° C. at atmosphere.
Figure 5C:
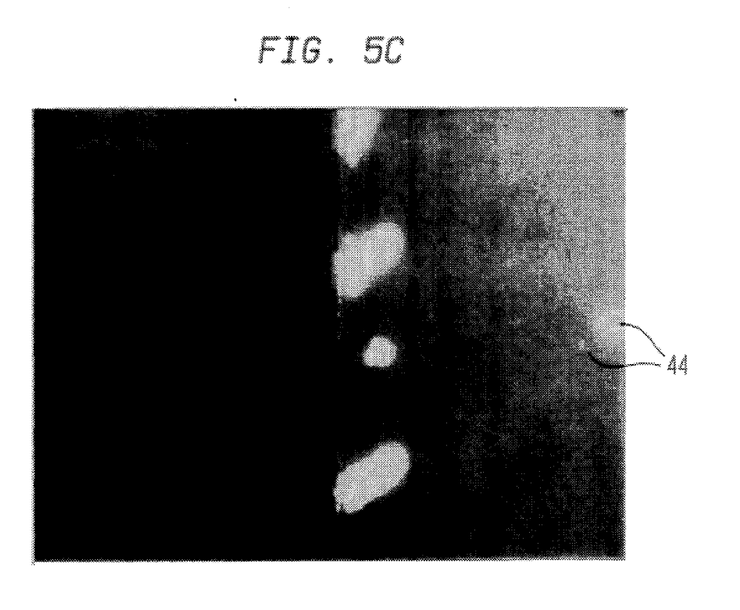

C. temperature. As can be seen, the diamond film 40 has original surface morphology. FIG. 5B shows the quartered sample that was heated in the oven. The heated sample exhibited some very small streaked areas 42 that are devoid of diamond. Otherwise, the heated and unheated quarters looked basically the same. On closer examination of both the heated and unheated quartered samples using a high power optical microscope, it was verified that the diamond film of the heated quartered sample was not affected except for the presence of some relatively small circular voids 44 found in the streaked areas as shown in FIG. 5C. It was further observed that the edge of the heated sample was still well protected indicating that the coverage of the silicon nitride was good.

Figure 6A:
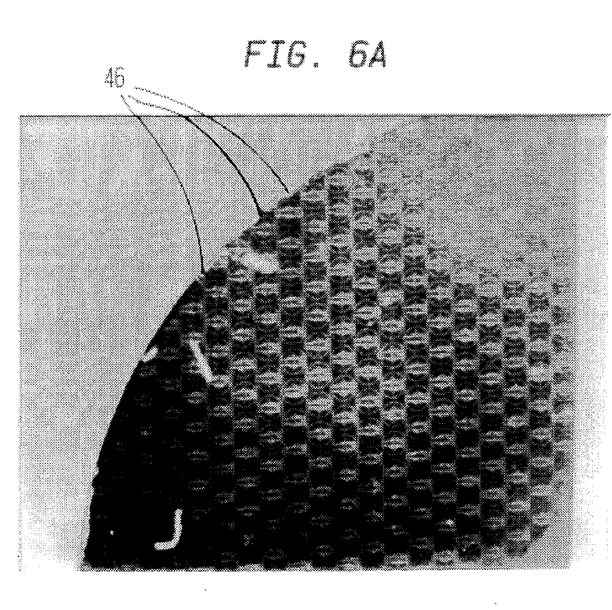
FIG. 6A is a photograph of a single passivation after 800° C. at atmosphere.
Figure 6B:
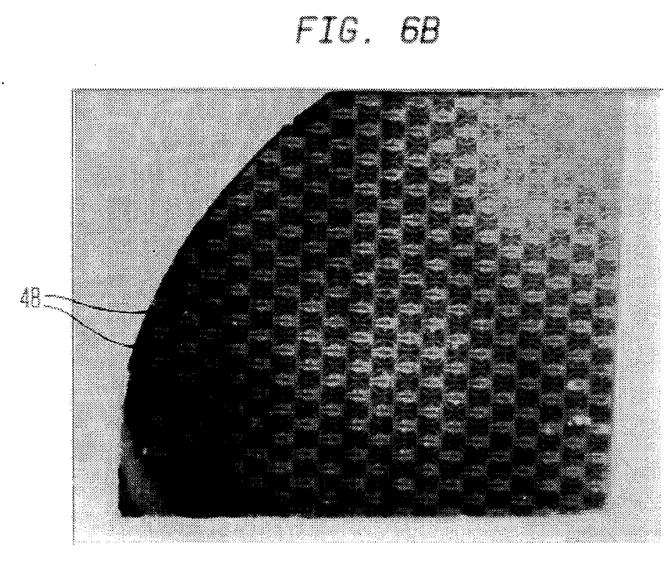
FIG. 6B is a photograph of a double layer passivation after 800° C. at atmosphere.

The circular voids found in the streaked areas of the heated quartered sample are generally believed to be the direct result of pin holes in the nitride. To test this belief, a sample was prepared by depositing a layer of quartz over the nitride. This sample was then subjected to 800° C. for 30 minutes. Examination of this double layered sample revealed fewer areas devoid of diamond, which is a marked improvement over the single layer sample described above. Single and double layered samples were subsequently processed to fabricate transducer sensor patterns. FIGS. 6A and 6B illustrate the differences between the single layer samples 46 and the double layered samples 48 after 800° C. at atmosphere. Using a Dektak, the thickness of the silicon nitride was determined to be 800 Å and the thickness of the quartz layer was 1000 Å. These thicknesses are negligibly small when compared to the thickness of the mechanically active element of the pressure sensor and thus would have little effect on its sensitivity.

It should be understood that the embodiments described herein are merely exemplary and that a person skilled in the art may make many variations and modifications to the embodiments utilizing functionally equivalent elements to those described herein. Any and all such variations or modifications as well as others which may become apparent to those skilled in the art, are intended to be included within the scope of the invention as defined by the appended claims.

What is claimed is:

1. A method for preventing a diamond film coated on a substrate from oxidizing at temperatures above 800° C. in an oxygen atmosphere, comprising the steps of:

placing said diamond film coated on the substrate into a reactor set a first temperature which is below a temperature at which diamond oxidizes;

evacuating said reactor set at the first temperature remove all oxygen therefrom;

raising said reactor to a second temperature; and depositing a passivation layer over said diamond film at the second temperature, whereby said passivation layer prevents said diamond film from oxidizing at temperatures above 800° C. in an oxygen atmosphere.

2. The method according to claim 1, wherein said first temperature is approximately 550° C.

3. The method according to claim 1, wherein said reactor is evacuated down to 1 milli-Torr.

4. The method according to claim 1, wherein said second temperature is approximately 750° C.

5. The method according to claim 1, wherein said step of depositing a passivation layer over said diamond film further includes injecting ammonia and dichlorosilane into said reactor.

6. The method according to claim 1, wherein said passivation layer includes a layer of nitride.

7. The method according to claim 6, further comprising the step of coating said layer of nitride with a layer of quartz, whereby said layer of quartz operates in conjunction with said layer of nitride to passivate said diamond film.

8. The method according to claim 7, further comprising the step of annealing said substrate to create a dense and non-porous quartz layer.

9. The method according to claim 8, where said step of annealing is performed at approximately 625° C. in the presence of wet oxygen.

10. The method according to claim 1, further comprising the step of coating said passivation layer with a second passivation layer, whereby said layers operate to passivate said diamond film.

11. A method for fabricating at least one semiconductor element on a diamond film coated on a substrate, comprising the steps of:

placing said diamond film coated on the substrate into a reactor set a first temperature which is a temperature at which diamond oxidizes;

evacuating said reactor set at the first temperature remove all oxygen therefrom;

raising said reactor to a second temperature;

depositing a passivation layer over said diamond film at the second temperature, said layer operating to passivate said diamond film;

patterning said layer to selectively expose regions of said diamond film and to provide passivated regions; and oxidizing said selectively exposed regions of said diamond film to define said at least one semiconductor element in said diamond film.

12. The method according to claim 11, wherein said first temperature is approximately 550° C.

13. The method according to claim 11, wherein said reactor is evacuated down to 1 milli-Torr.

14. The method according to claim 11, wherein said second temperature is approximately 750° C.

15. The method according to claim 11, wherein said step of depositing a passivation layer over said diamond film further includes injecting ammonia and dichlorosilane into said reactor.

16. The method according to claim 11, wherein said step of patterning includes the steps of:

coating said passivation layer with quartz;

patterning said quartz to create a mask for said layer; and patterning said layer using said quartz mask.

17. The method according to claim 16, further comprising the step of annealing said substrate to create a dense and non-porous quartz layer.

18. The method according to claim 17, wherein said passivation layer includes a layer of nitride.

19. The method according to claim 16, where said step of annealing is performed at approximately 625° C. in the presence of wet oxygen.

20. The method according to claim 11, wherein said step of oxidizing is performed at a temperature of approximately 700° C. in the presence of oxygen.

21. The method according to claim 11, wherein said passivated regions of said diamond film enable said at least one semiconductor element to operate in temperatures up to 800° C. in an oxygen atmosphere.

22. The method according to claim 11, wherein said at least one semiconductor element includes a transducer sensor.

* * * * *